United States Patent [19]
Wells, III et al.

[11] Patent Number: 5,551,431
[45] Date of Patent: Sep. 3, 1996

[54] CORRECTION OF MAGNETIC RESONANCE IMAGER INTENSITY INHOMOGENEITIES USING TISSUE PROPERTIES

[75] Inventors: William M. Wells, III, Cambridge; Ron Kikinis, Brookline, both of Mass.

[73] Assignee: The Brigham and Women's Hospital, Inc., Boston, Mass.

[21] Appl. No.: 318,057

[22] Filed: Oct. 4, 1994

[51] Int. Cl.$^6$ ................................................ A61B 5/055
[52] U.S. Cl. ........................ 128/653.2; 324/307; 324/309
[58] Field of Search ........................ 128/653.2; 324/307, 324/309

[56] References Cited

U.S. PATENT DOCUMENTS 5,001,428  3/1991  Maier et al. ............................ 324/309
5,260,654  11/1993  Cory ...................................... 324/309
5,274,331  12/1993  Macovski ............................... 324/309

*Primary Examiner*—Krista M. Zele
*Assistant Examiner*—Brian L. Casler
*Attorney, Agent, or Firm*—Dennis M. Flaherty

[57] ABSTRACT

A statistical method for correcting for intensity inhomogeneities in the images produced by magnetic resonance imaging equipment. The method uses knowledge of tissue properties and gain inhomogeneities to correct the gain artifact, thereby improving intensity-based segmentation of the volume spanned by the imagery into the various tissue types that are present. The method utilizes the Expectation-Maximization algorithm to simultaneously estimate tissue class and the radiofrequency gain field. The algorithm iterates two components to convergence: tissue classification and gain field estimation. The method combines them in an iterative scheme that yields a powerful technique for estimating tissue class and radiofrequency gain.

17 Claims, 2 Drawing Sheets

CORRECTION OF MAGNETIC RESONANCE IMAGER INTENSITY INHOMOGENEITIES USING TISSUE PROPERTIES

FIELD OF THE INVENTION

This invention relates to magnetic resonance imaging of the human body. More particularly, the invention relates to a method and an apparatus for correcting intensity inhomogeneities in the images produced by magnetic resonance imaging (MRI) equipment.

BACKGROUND OF THE INVENTION

MRI has proven to be a revolutionary diagnostic radiological tool, due to its high spatial resolution and excellent discrimination of soft tissues. MRI provides rich information about anatomical structure, enabling quantitative anatomical studies of diseases, the derivation of computerized anatomical atlases, as well as three-dimensional visualization of internal anatomy, for use in pre- and intra-operative visualization, and in the guidance of therapeutic intervention.

Applications that use the structural contents of MRI are facilitated by segmenting the imaged volume into tissue types. Such tissue segmentation is often achieved by applying statistical classification methods to the signal intensities, in conjunction with morphological image processing operations.

Conventional intensity-based classification of MR images has proven problematic, even when advanced techniques such as non-parametric multi-channel methods are used. Accommodating the intra-scan spatial intensity inhomogeneities that are due to the equipment has proven to be a persistent difficulty.

A conventional MRI system is generally depicted in FIG. 1. The tissue sample is inserted into a constant homogeneous magnetic field produced by main coil 4 of a main magnet 2. To enable spatial encoding of the image, the main magnetic field is varied in strength by the application of gradient magnetic fields produced by a bank of gradient coils 8, which are driven by selectively activated gradient amplifiers 6. The gradient fields make the frequencies and phase at which nuclear magnetic resonance (NMR) occurs vary with position. NMR in the tissue is excited by a magnetic field induced by transmitting coil 12, which is driven by RF electronics module 10. When the transmitting coil 12 is switched off, the tissue radiates RF signals which induce current in receiving coil 14. The RF electronics module 10 incorporates circuitry for detecting the currents induced in receiving coil 14.

Driving of the gradient coils 8 and the transmitting coil 12 is controlled by the central processing unit 20 via an input/output module 18. The measurement data is processed by CPU 20 and stored in memory 22. Optionally, the CPU 20 is connected to an arithmetic co-processor 24.

The MRI signal is derived from the RF signals emanating from the scanned tissues. Many RF coils (antennas) 12 and 14 are designed to have uniform RF sensitivity or gain throughout their working volume. Although images derived from such coils appear visually uniform, there are often significant departures from the ideal that disturb intensity-based segmentation methods. One arena where this is often apparent is differentiating white matter and gray matter in the brain. In the ideal case these tissue types give rise to distributions of intensities that are easily distinguished. In practice, the spatial intensity inhomogeneities are often of sufficient magnitude to cause the distributions of intensities associated with these two classes to overlap significantly. In addition, details of the operating conditions of the equipment have a significant effect on the observed intensities, often necessitating manual training on a per-scan basis. Therefore, a reliable method is needed to correct and segment MR images.

SUMMARY OF THE INVENTION

The present invention is a method for correcting for intensity inhomogeneities in the radiofrequency sensitivity of MRI equipment. The method uses knowledge of tissue properties and intensity inhomogeneities to correct and segment MR images. The method (hereinafter referred to as "adaptive segmentation") allows for more accurate segmentation of tissue types as well as better visualization of MRI data.

The MRI intensity inhomogeneities that are compensated for by the adaptive segmentation method of the present invention are modeled as a spatially varying factor called the "gain field" that multiplies the intensity data. The application of a logarithmic transformation to the intensities allows the artifact to be modeled as an additive bias field.

In arriving at the present invention, a Bayesian approach was used to estimate the bias field that represents the gain artifact in log-transformed MR intensity data. Then the Expectation-Maximization algorithm is utilized to simultaneously estimate tissue class and the correcting gain field. The algorithm as it has been applied here has two components: tissue classification and gain field estimation. The method combines them in an iterative scheme that yields a powerful new technique for estimating tissue class and the gain field.

DETAILED DESCRIPTION OF THE PREFERRED EMBODIMENTS

Figure 1:
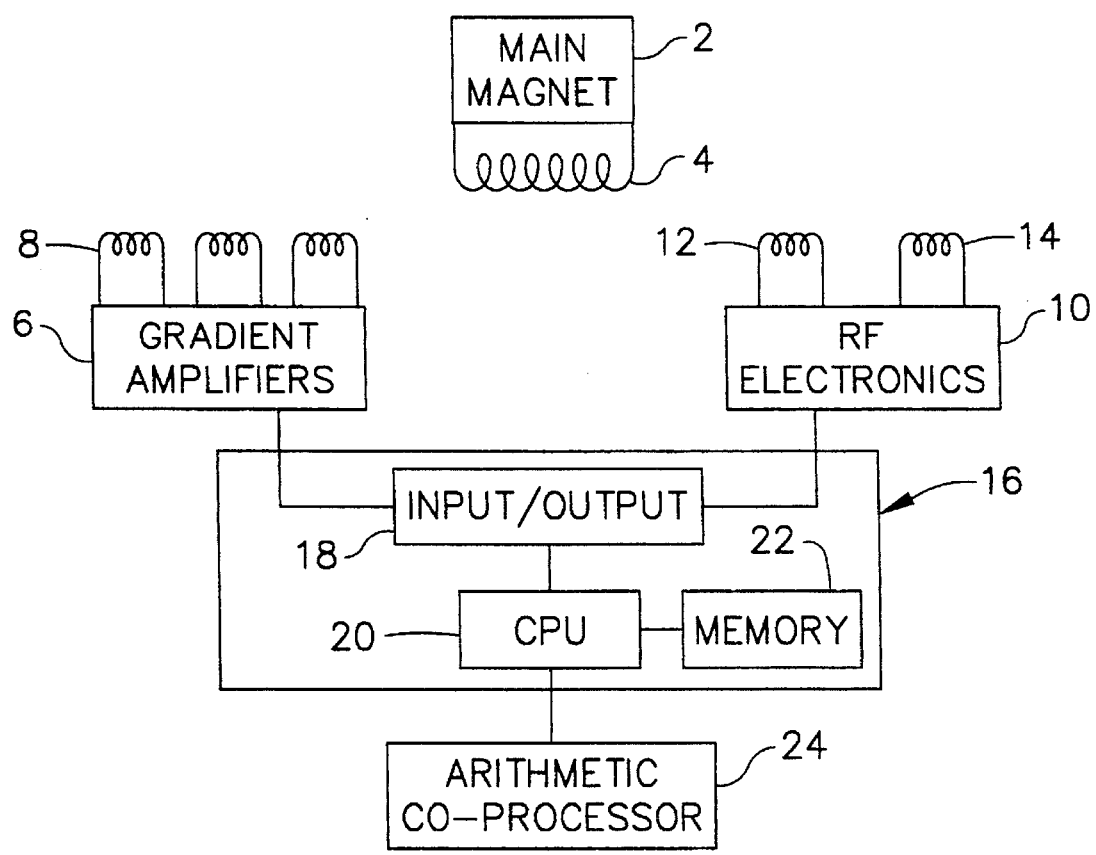
FIG. 1 is a block diagram illustrating the organization of a conventional MRI system.

The method in accordance with the present invention is based on the following observations: (1) If the gain field is known, then it is relatively easy to estimate tissue class by applying a conventional intensity-based segmenter to the corrected data. (2) If the tissue classes are known, then it is straightforward to estimate the gain field by comparing predicted intensities and observed intensities. (3) It may be problematic, however, to determine either the gain or the tissue type without knowledge of the other. The strategy used by the present method is to estimate the tissue type and the gain throughout the image, simultaneously.

The MRI gain artifact of concern for the present invention is a spatially varying factor that multiplies the intensity data. Application of a logarithmic transformation to the intensities allows the artifact to be modeled as an additive bias field.

In accordance with the present invention, a Bayesian approach to estimating the bias field is taken that represents the gain artifact in log-transformed MR intensity data. We first compute a logarithmic transformation of the intensity data as follows:

$$Y_i = g(X_i) = (\ln([X_i]_1), \ln([X_i]_2), \ldots, \ln([X_i]_m))^T \quad (1)$$

where $X_i$ is the observed MRI intensity at the i-th voxel, and m is the dimension of the MRI signal (for example, m=2 for a double-echo MRI acquisition).

Similar to other approaches to intensity-based segmentation of MRI, the distribution for observed values is modeled as a normal distribution (with the incorporation of an explicit bias field):

$$p(Y_i | \Gamma_i, \beta_i) = G_{\psi_{\Gamma_i}}(Y_i - \mu - \beta_i) \quad (2)$$

where $$G_{\psi_{\Gamma_i}}(x) \equiv (2\pi)^{-m/2} |\psi_{\Gamma_i}|^{-1/2} \exp(-\tfrac{1}{2} x^T \psi_{\Gamma_i}^{-1} x)$$

is the m-dimensional Gaussian distribution with variance $\psi_{\Gamma_i}$, and where $Y_i$ is the observed log-transformed intensity at the i-th voxel, $\Gamma_i$ is the tissue class at the i-th voxel (for example, when segmenting brain tissue, $\Gamma_i \in$ {white-matter, gray-matter, cerebro-spinal fluid}), $\mu(x)$ is the mean intensity for tissue class x, $\psi_x$ is the covariance matrix for tissue class x, and $\beta_i$ is the bias field at the i-th voxel. $Y_i$, $\mu(x)$ and $\beta_i$ are represented by m-dimensional column vectors, while $\psi_x$ is represented by an m×m matrix. The bias field has a separate value for each component of the log-intensity signal at each voxel.

A stationary prior (before the image data is seen) probability distribution on tissue class, denoted $p(\Gamma_i)$, is used. If this probability is uniform over tissue classes, the method of the present invention devolves to a maximum-likelihood approach to the tissue classification component. A spatially varying prior probability density on brain tissue class is described by Kamber et al. in "Model-Based 3D Segmentation of Multiple Sclerosis Lesions in Dual-Echo MRI Data", SPIE Vol. 1808, Visualization in Biomedical Computing 1992 (1992).

The entire bias field is denoted by $\beta = (\beta_0, \beta_1, \ldots, \beta_{n-1})^T$, where n is the number of voxels of data. The bias field is modeled by a n-dimensional zero mean Gaussian prior probability density:

$$p(\beta) = G_{\psi_\beta}(\beta) \quad (3)$$

where $$G_{\psi_\beta}(x) \equiv (2\pi)^{-n/2} |\psi_\beta|^{-1/2} \exp(-\tfrac{1}{2} x^T \psi_\beta^{-1} x) \quad (4)$$

is the n-dimensional Gaussian distribution. $\psi_\beta$ is the n×n covariance matrix for the entire bias field. This model is used to capture the smoothness that is apparent in these inhomogeneities. Although $\psi_\beta$ will be too large to manipulate directly in practice, it will be shown below that tractable estimators result when $\psi_\beta$ is chosen so that it is banded.

It is assumed that the bias field and the tissue classes are statistically independent. This follows if the intensity inhomogeneities originate in the equipment. Using the definition of conditional probability, the joint probability on intensity and tissue class conditioned on the bias field may be obtained as:

$$p(Y_i, \Gamma_i | \beta_i) = p(Y_i | \Gamma_i, \beta_i) p(\Gamma_i) \quad (5)$$

The conditional probability of intensity alone may be obtained by computing a marginal over tissue class:

$$p(Y_i | \beta_i) = \sum_{\Gamma_i} p(Y_i, \Gamma_i | \beta_i) = \sum_{\Gamma_i} p(Y_i | \Gamma_i, \beta_i) p(\Gamma_i) \quad (6)$$

Thus, the foregoing modeling has led to a class-independent intensity model that is a mixture of Gaussian populations, one population for each tissue class. Since this model is a Gaussian mixture, rather than a purely Gaussian density, the estimators derived below are nonlinear.

In the present method, statistical independence of voxels is assumed (in other words, the noise in the MR signal is spatially white). The probability density for the entire image may then be written as follows:

$$p(Y | \beta) = \prod_i p(Y_i | \beta_i) \quad (7)$$

Bayes' rule is then used to obtain the posterior probability of the bias field, given observed intensity data, as follows:

$$p(\beta | y) = \frac{1}{p(Y)} p(Y | \beta) p(\beta) \quad (8)$$

where p(Y) is an unimportant normalizing constant.

Having obtained the posterior probability of the bias field, the maximum-a-posteriori (MAP) principle is now used to formulate an estimate of the bias field as the value of $\beta$ having the largest posterior probability, $$\hat{\beta} = \arg\max_\beta p(\beta | y) \quad (9)$$

A necessary condition for a maximum of the posterior probability of $\beta$ is that its gradient with respect to $\beta$ be zero. An equivalent zero-gradient condition on the logarithm of the posterior probability is then used:

$$\left[ \frac{\partial}{\partial [\beta_i]_k} \ln p(\beta | y) \right]_{\beta = \hat{\beta}} = 0 \; \forall_{i,k} \quad (10)$$

where $[\beta_i]_k$ is the k-th component of the bias field at voxel i. Installing the statistical modeling of Eqs. (2)–(9) yields the following expression for the zero gradient condition:

$$\left[ \frac{\partial}{\partial [\beta_i]_k} \left( \sum_j \ln p(Y_j | \beta_j) + \ln p(\beta) \right) \right]_{\beta = \hat{\beta}} = 0 \; \forall_{i,k}$$

Since only the i-th term of the sum depends on $\beta_i$, we obtain (after differentiating the logarithms):

$$\left[ \frac{\frac{\partial}{\partial [\beta_i]_k} p(Y_i | \beta_i)}{p(Y_i | \beta_i)} + \frac{\frac{\partial}{\partial [\beta_i]_k} p(\beta)}{p(\beta)} \right]_{\beta = \hat{\beta}} = 0 \; \forall_{i,k}$$

Using Eqs. (2) and (6), the last equation may be written as:

$$\left[ \frac{\sum_{\Gamma_i} p(\Gamma_i) \frac{\partial}{\partial [\beta_i]_k} G_{\psi_{\Gamma_i}}(Y_i - \mu(\Gamma_i) - \beta_i)}{\sum_{\Gamma_i} p(\Gamma_i) G_{\psi_{\Gamma_i}}(Y_i - \mu(\Gamma_i) - \beta_i)} + \frac{\frac{\partial}{\partial [\beta_i]_k} p(\beta)}{p(\beta)} \right]_{\beta = \hat{\beta}} = 0 \; \forall_{i,k}$$

Differentiating the Gaussian expression in the first term yields:

$$\left[\frac{\Sigma_{\Gamma_i} p(\Gamma_i) G_{\psi_{\Gamma_i}}(Y_i - \mu(\Gamma_i) - \beta_i)[\psi_{\Gamma_i}^{-1}(Y_i - \mu(\Gamma_i) - \beta_i)]_k}{\Sigma_{\Gamma_i} p(\Gamma_i) G_{\psi_{\Gamma_i}}(Y_i - \mu(\Gamma_i) - \beta_i)} + \frac{\frac{\partial}{\partial [\beta_i]_k} p(\beta)}{p(\beta)}\right]_{\beta=\bar{\beta}} = 0 \; \forall_{i,k}$$

This expression may be written more compactly as:

$$\left[\sum_j W_{ij}[\psi_j^{-1}(Y_i - \mu_j - \beta_i)]_k + \frac{\frac{\partial}{\partial [\beta_i]_k} p(\beta)}{p(\beta)}\right]_{\beta=\bar{\beta}} = 0 \; \forall_{i,k} \quad (11)$$

with the following definition of weights $W_{ij}$:

$$W_{ij} \equiv \frac{[p(\Gamma_i) G_{\psi_{\Gamma_i}}(Y_i - \mu(\Gamma_i) - \beta_i)]_{\Gamma_i = tissue\text{-}class\text{-}j}}{\Sigma_{\Gamma_i} p(\Gamma_i) G_{\psi_{\Gamma_i}}(Y_i - \mu(\Gamma_i) - \beta_i)} \quad (12)$$

where subscripts i and j refer to voxel index and tissue class respectively, and where $$\mu_j \equiv \mu(\text{tissue-class-}j)$$

is the mean intensity of tissue classsss j. Equation (11) may be re-expressed as follows:

$$\left[\sum_j W_{ij}[\psi_j^{-1}(Y_i - \mu_j)]_k - \sum_j W_{ij}[\psi_j^{-1}\beta_i]_k + \frac{\frac{\partial}{\partial [\beta_i]_k} p(\beta)}{p(\beta)}\right]_{\beta=\bar{\beta}} = 0 \; \forall_{i,k}$$

or as $$\left[[\bar{R}_i]_k - [\overline{\psi_{ii}^{-1}}\beta_i]_k + \frac{\frac{\partial}{\partial [\beta_i]_k} p(\beta)}{p(\beta)}\right]_{\beta=\bar{\beta}} = 0 \; \forall_{i,k} \quad (13)$$

with the following definitions for the mean residual, $$\bar{R}_i \equiv \sum_j W_{ij}\psi_j^{-1}(Y_i - \mu_j) \quad (14)$$

and the mean inverse covariance, $$\overline{\psi_{ik}^{-1}} \equiv \begin{cases} \sum_j W_{ij}\psi_j^{-1} & \text{if } i = k \\ 0 & \text{otherwise} \end{cases} \quad (15)$$

The mean residuals and mean inverse covariances defined above are averages taken over the tissue classes, weighted according to $W_{ij}$.

Equation (13) may be re-expressed in matrix notation as:

$$\left[\bar{R} - \overline{\psi^{-1}}\beta + \frac{\nabla_\beta p(\beta)}{p(\beta)}\right]_{\beta=\bar{\beta}} = 0$$

Differentiating the last term yields the following:

$$\bar{R} - \overline{\psi^{-1}}\bar{\beta} - \psi_\beta^{-1}\bar{\beta} = 0$$

Finally, the zero-gradient condition for the bias field estimator may be written concisely as:

$$\bar{\beta} = H\bar{R} \quad (16)$$

where the linear operator H is defined by:

$$H \equiv [+e, ovs \; \psi^{-1+ee} + \psi_\beta^{-1}]^{-1} \quad (17)$$

that is, the bias field estimate is derived by applying the operator H to the mean residual field, and H is determined by the mean covariance of the tissue classes and the covariance of the bias field.

The bias field estimator of Eq. (16) has some resemblance to being a linear estimator in Y of the bias field $\beta$. It is not a linear estimator, however, owing to the fact that the weights $W_{ij}$ that appear in the expression for $\bar{R}$ and H are themselves nonlinear functions of Y (see Eq. (12)).

The result of the foregoing statistical modeling has been to formulate the problem of estimating the bias field as a nonlinear optimization problem embodied in Eq. (16). An approach to obtaining solutions (estimates) of this problem is described hereinafter.

In accordance with the present invention, the Expectation-Maximization (EM) algorithm is used to obtain bias field estimates from the nonlinear estimator of Eq. (16). The EM algorithm was originally described in its general form by A. P. Dempster, N.M. Laird and D. B. Rubin in "Maximum Likelihood from Incomplete Data via the EM Algorithm", J. Roy. Statist. Soc., 39, 1–38 (1977). It is often used in estimation problems where some of the data is "missing". In this application the missing data is knowledge of the tissue classes. If the tissue classes were known, then estimating the bias field would be straightforward.

In this application, the EM algorithm iteratively alternates evaluations of the expressions appearing in Eqs. (12) and (16):

$$W_{ij} \leftarrow \frac{[p(\Gamma_i) G_{\psi_{\Gamma_i}}(Y_i - \mu(\Gamma_i) - \beta_i)]_{\Gamma_i = tissue\text{-}class\text{-}j}}{\Sigma_{\Gamma_i} p(\Gamma_i) G_{\psi_{\Gamma_i}}(Y_i - \mu(\Gamma_i) - \beta_i)} \quad (18)$$

and $$\bar{\beta} \leftarrow H\bar{R} \quad (19)$$

In other words, Eq. (18) is used to estimate the weights, given an estimated bias field; then Eq. (19) is used to estimate the bias, given estimates of the weights.

As is usual with the EM algorithm, the two components of the iteration have simple interpretations. Equation (18) (the E-step) is equivalent to calculating the posterior tissue class probabilities (a good indicator of tissue class) when the bias field is known. Equation (19) (the M-Step) is equivalent to a MAP estimator of the bias field when the tissue probabilities W are known. A good indication of tissue class is produced by this algorithm as a side effect of estimating the bias field.

Figure 4:
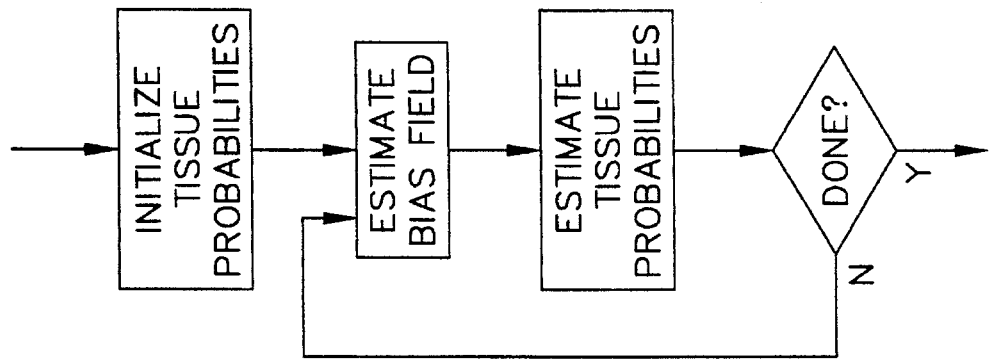
FIG. 4 is a flowchart illustrating a technique for correcting intensity inhomogeneities in the RF sensitivity of MRI equipment in accordance with an alternative embodiment of the invention.
Figure 3:
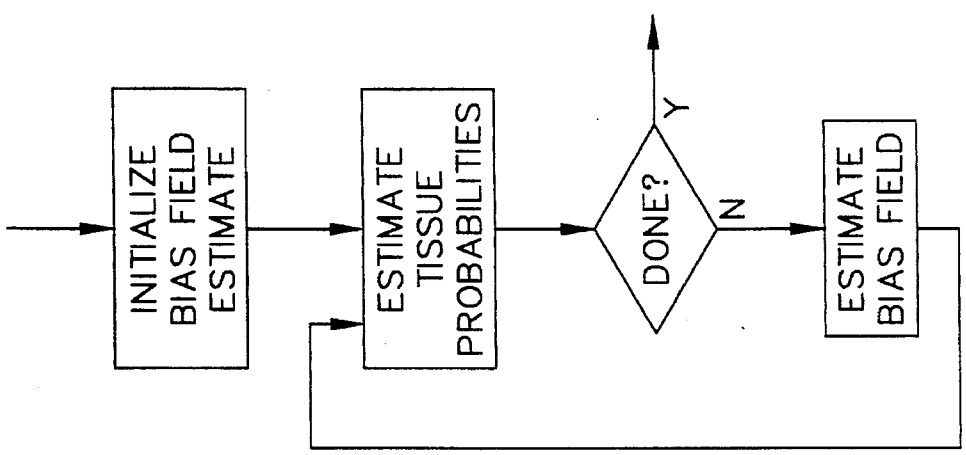
FIG. 3 is a flowchart illustrating a technique for correcting intensity inhomogeneities in the RF sensitivity of MRI equipment in accordance with a preferred embodiment of the invention.

The iteration may be started on either Eq. (18), as depicted in FIG. 3, or Eq. (19), as depicted in FIG. 4. Initial values for the weights will be needed for starting with the expression of Eq. (19), and initial values for the bias field will be needed for starting with the expression of Eq. (18). The expressions are then iterated multiple times until convergence is achieved. These iterations will never worsen the value of the objective function. Provided that the bias estimates are bounded, the above model satisfies the necessary conditions for guaranteed convergence, although there is no guarantee of convergence to the global minimum. The algorithm is performed by the central processing unit and, if needed, the arithmetic co-processor.

In principle, given $\mu(\Gamma_i)$, $\psi_\beta$ and $\psi_j$, the EM algorithm could be used to obtain the needed estimates. In practice, $\psi_\beta$ cannot be directly measured, so a technique for estimating $\psi_\beta$ is needed.

Although the covariance matrix $\psi_\beta$ that characterizes the prior on bias fields is impractically large in general, it can be demonstrated that tractable estimation algorithms may yet be obtained.

From an engineering standpoint, $\psi_\beta$ may be chosen in the following way:

$$\psi_\beta = LL^T \quad (20)$$

where L represents a "practical" low-pass filter. Then (referring to Eq. (4)):

$$p(\beta) \propto \exp(-\tfrac{1}{2}|L^{-1}\beta|^2)$$

and $L^{-1}$ will amplify high-frequency components of $\beta$ since it is the inverse of a low-pass filter. It is clear that this form of prior model on bias fields will have lower probabilities to the extent that the bias field contains high-frequency components.

Further, $\psi_\beta$ may be chosen to be a banded matrix. This will occur if L represents a finite impulseresponse (FIR) low-pass filter. Equation (16) may be written in the following way:

$$[I + \psi_\beta \overline{\psi^{-1}}]\beta = \psi_\beta \overline{R}$$

In this case, calculating $\psi_\beta \overline{R}$ is tractable, since $\psi_\beta$ is banded, and solving the linear system for $\hat{\beta}$ will also be tractable, since $(I+\psi_\beta \overline{\psi^{-1}})$ is banded (note that $\overline{\psi^{-1}}$ is diagonal).

In accordance with the method of the present invention, a Bayesian approach to estimating the bias field and tissue classes has been taken, and a formal prior model on bias field has been assumed. This approach makes it possible to derive a version of the EM algorithm for this application. The prior model on the bias field is subjective in that we use a subjective estimate of the unknown probability law. The operator H is related to the prior on the bias field via $\psi_\beta^{-1}$ and to the measurement noise $\overline{\psi^{-1}}$. Ideally, H would be determined by estimating the covariance $\psi_\beta$, but given the size of this matrix, such an approach is impractical.

As pointed out above, H is the MAP estimator of the bias field when the tissue probabilities are known (the "complete data" case with the EM algorithm). As such, H is an optimal estimator (with respect to the Gaussian modeling), and is also the optimal linear least squares estimator (LLSE) for arbitrary zero-mean models of the bias field whose second-order statistics are characterized by $\psi_\beta$.

Optimal filters may often be equivalently chacterized within the related formalisms of estimation theory and random processes. Although filters are perhaps more commonly described within the framework of random processes, for the application disclosed herein estimation theory has been used to derive the EM algorithm. In terms of random processes, H is essentially equivalent to the LLSE for discrete random processes with given second-order statistics (autocorrelation functions). Such estimators are characterized by the Wiener-Hopf equations. Applications of Wiener filtering are often approached via Fourier transform methods, yielding a filter frequency response in terms of the power spectra of the signal and noise. In such applications, the noise spectra are often known, and the signal spectra are sometimes estimated using techniques of spectral estimation.

A frequent problem that arises in filter design (the present complete-data case included) is that of estimating a slowly varying signal that has been contaminated with white noise. The optimal filter in such situations will be a low-pass filter.

In practice, it is difficult to obtain the optimal linear filter. H may be instead chosen as a good engineering approximation of the optimal linear filter, as described later. In this case, Eqs. (18) and (19) are still a useful estimator for the missing data case. This is the approach taken in implementing the present invention, wherein the filter was selected empirically. Thus, the optimal H will be a linear low-pass filter, when tissue class is constant.

A particularly efficient filter H has been designed that satisfies the low-pass property described above. A filter was used which can be characterized as follows:

$$\hat{\beta}_i = \frac{[F\overline{R}]_i}{[F\overline{\psi^{-1}}1]_i} \quad (21)$$

where $$1 \equiv (1,1,1,\ldots,1)^T$$

The filter specified above is clearly linear in the mean residual, and it will be a low-pass filter when the tissue class is constant, provided that F is. It has been designed to have unity DC gain. If F is chosen to be a computationally efficient low-pass filter, then the filter specified by Eq. (21) will also be computationally efficient.

The formalism simplifies somewhat when the tissue classes have the same covariance. In this case, $\psi_j^{-1} = \psi^{-1}$ and $$\overline{\psi_{ii}^{-1}} = \sum_j W_{ij} \psi^{-1} = \psi^{-1}$$

so that $$\overline{\psi^{-1}} = \text{DIAG}(\psi^{-1}, \psi^{-1}, \psi^{-1}, \ldots, \psi^{-1})$$

In this case H will be essentially a shift-invariant linear filter, provided that $\beta$ is stationary. The expression for the mean residual simplifies to the following matrix expression:

$$\overline{R} = +e, ovs \; \psi^{-1+ee} \; [Y-WU]$$

where W is the matrix of the weights $W_{ij}$, and U is a column vector containing the class mean intensities: $U=(\mu_1, \mu_2, \ldots, \mu_m)T$.

In the case of scalar data, $\psi^{-1} = 1/\sigma^2$ and the bias estimator may be written as:

$$\hat{\beta} = [I + \sigma^2 \psi_\beta^{-1}]^{-1}[Y-WU] \quad (22)$$

The bias estimator of Eq. (22) is particularly simple. It is a shift-invariant linear low-pass filter applied to the difference between the observed intensities and a prediction of the signal that is based on the weights (which are a good estimator of tissue class).

An extension of the segmentation method in accordance with an alternate embodiment of the invention uses a form of non-parametric tissue class conditional intensity models that were described by Kikinis et al. in "Quantitative Analysis of Brain and Cerebrospinal Fluid Spaces with MR Imaging" JMRI Vol. 2 pp 619–629 (1992), the contents of which are specifically incorporated by reference herein.

The method of the preferred embodiment described above has two main components: tissue classification and bias field estimation. Our approach in the extended method is to use the same basic iteration, and to replace the tissue classification component with the technique of Kikinis et al. In more detail, the invention can use the intensity probability densities described in the Kikinis et al. report for the calculation of the weights in the E step, and substitute approximations of the means and covariances of the non-parametric densities for their counterparts in Eqs. (14) and (15).

The classifier described in the Kikinis et al. report uses the Parzen Window representation for nonparametric probability densities [as disclosed in "Pattern Classification and Scene Analysis" by R.O. Duda and P.E. Hart, John Wiley and Sons (1973)] that are derived from training data. The tissue class conditional models may be written as follows:

$$p_x(X_i | \Gamma_i = \text{tissue-class-}j) = \frac{1}{n_j} \sum_k G_{\psi_0}(X_i - X_{kj}) \quad (23)$$

where $X_i$ is the MR intensity at voxel i, $G_{\psi_0}(x)$ is a radially-symmetric Gaussian density, and $X_{kj}$ are the intensities of the $n_j$ training points for tissue class j.

In the expression for the weights (Eq. (18)), the non-parametric class conditional densities $P_Y(Y_i - \beta_i | \Gamma_i)$ are used in place of the Gaussian densities.

The non-parametric tissue class conditional intensity models were derived from training in the "natural" (i.e., not log-transformed) MR intensities. In view of the logarithmic transformation of the intensity data in Eq. (1), the following standard formula for transforming probability densities can be used:

$$p_Y(Y_i | \Gamma_i) = \frac{p_x(g^{-1}(Y_i) | \Gamma_i)}{\frac{\partial g}{\partial X_i} | g^{-1}(Y_i)|}$$

For double-echo data the resulting expression for the probability density on log-transformed data is:

$$p_y(Y_i | \Gamma_i) = \exp(Y_1) \exp(Y_1) p_x((\exp(Y_1), \exp(Y_2))^T | \Gamma_i)$$

where $P_x$ is the non-parametric density described in Eq. (23).

In the expressions for the average residual (Eq. (14)) and average covariance (Eq. (15)), we approximate with the empirical tissue class means and covariances from the log-transformed training data, as follows:

$$\mu_j = \frac{1}{n_j} \sum_k Y_{kj}$$

and $$\psi_j = \frac{1}{n_j} \sum_k (Y_{kj} - \mu_j)(Y_{kj} - \mu_j)^T$$

where $Y_{kj} = g(X_{kj})$ are the nj log-transformed intensities of the training points for tissue class j.

An implementation of the present invention was applied to the segmentation of the brain into white matter and gray matter in spin-echo and fast-spin-echo images. MR images were obtained using a General Electric Signa 1.5 Tesla clinical MR imager. An anisotropic diffusion filter was used as a preprocessing step to reduce noise.

Brain segmentation results were obtained using a implementation coded in the C programming language. This single-channel implementation accommodates two tissue classes, and uses an input segmentation to limit the region of interest (ROI) to be classified and gain-corrected.

In this implementation, the EM algorithm was initiated on the "E step" (Eq. (18)) with a flat initial bias field. Iterated moving-average low-pass filters have been used for the operator H in Eq. (19). These filters have a low computational cost that is independent of the width of their support (amount of smoothing). The filters have been adapted to only operate in the input ROI, and to adjust the effective averaging window at boundaries to confine influence to the ROI. These filters are shift-invariant, except at the boundary regions. Window widths of 11 to 30 were used. One to four filtering passes have been used with similar results. A uniform distribution was used for the prior on tissue class.

In the more challenging applications, where the gain variation was large, the algorithm was used on log-transformed data—transforming the MR gain artifact into a bias artifact. In the less challenging applications it was found that log transformation was not needed to achieve good results, since a near-unity gain artifact on two classes of similar mean intensity is reasonably approximated as a bias artifact.

The method of the invention has been found to be substantially insensitive to parameter settings. For a given type of acquisition, intensity variations across patients, scans and equipment have been accommodated in the estimated bias fields without the need for manual intervention. In this sense, the method is fully automatic for segmenting healthy brain tissue.

The algorithm of the present invention iterates two components to convergence: tissue classification and gain field estimation. The invention combines them in an iterative scheme that yields a powerful new method for estimating tissue class and RF gain. In a typical run the program was run until the estimates stabilized, typically in 10 to 20 iterations, requiring approximately 1 second per iteration on a Sun Microsystems Sparcstation 2.

The classification component of the method of the invention is similar to the method reported by Gerig et al. and Cline et al., previously cited. They used Maximum-Likelihood classification of voxels using normal models with two-channel MR intensity signals. They also describe a semiautomatic way of isolating the brain using connectivity.

Figure 2:
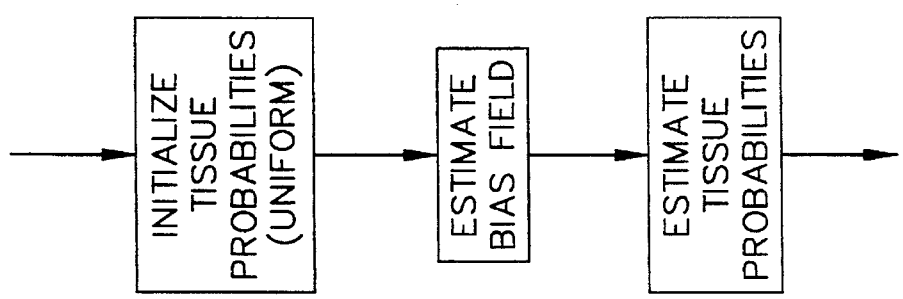
FIG. 2 is a flowchart illustrating a conventional technique for correcting intensity inhomogeneities in the RF sensitivity of MRI equipment.

The bias field estimation component of the method of the present invention is somewhat similar to prior art homomorphic filtering approaches. Lufkin et al. ["Dynamic-Range Compression in Surface-Coil MRI", AJR, 147(379), 379–382(1986)] and Axel et al. ["Intensity Correction in Surface-Coil MR Imaging", AJR, 148 (4), 418–420 (1987)] describe filtering approaches for controlling the dynamic range of surface-coil MR images. A low-pass-filtered version of the image is taken as an estimate of the gain field and used to correct the image. Lim and Pfferbaum ["Segmentation of MR Brain Images into Cerebrospinal Fluid Spaces, White and Gray Matter", JCAT, 13(4), 588–593 (1989)] used a similar approach to filtering that handles the boundary and then applies intensity-based segmentation to the result. Homomorphic filtering followed by classification in accordance with the prior art is depicted in FIG. 2.

On their own, the foregoing prior art methods are weaker than the present invention, because it is problematic to infer the RF gain from the image without knowing the tissue type. The essential difference is the method of the present invention uses knowledge of the tissue type to help infer the RF gain. Because of this, the invention is able to make better estimates of RF gain.

A prior art direct approach to correcting the RF gain inhomogeneity relies upon gain calibration using phantoms. Axel et al., previously cited, describe this approach. This approach is difficult with current clinical scanners, as the geometrical relation of the coils and the image data is not typically available with the image data.

Further, as formulated, the method of the present invention uses a spatially stationary prior on tissue class. The method could be made more powerful by using a spatially varying prior instead. Kamber et al. ["Model-Based 3D Segmentation of Multiple Sclerosis Lesions in Dual-Echo MRI Data", in: SPIE Vol 1808, Visualization in Biomedical Computing 1992 (1992)] describe such a prior for human brains.

The method of the invention facilitates automatic post-processing of medical images, in order to improve their appearance by correcting for the gain variations apparent in the image. This is an issue in general, and especially relevant with images derived from surface coils, where the large gain variations make it difficult to put the image data onto films for viewing. The gain variations can also be due to interactions of the tissue and the magnetic fields, via susceptibility artifacts.

The method of the invention makes segmenting MR images into tissue classes more practical, thus facilitating quantitative studies of anatomical structures, for instance, the measurement of the volume of white matter and gray matter in parts of the brain. By improving segmentation, the method also makes possible improved automatic three-dimensional reconstructions of anatomical structures. These are useful for purposes of visualization.

Finally, the method will have applications in all domains of imaging where correction of illumination gradients are necessary, for example, in photography and in processing satellite imagery.

The foregoing preferred embodiments have been disclosed for the purpose of illustration. Variations and modifications which do not depart from the broad concept of the invention will be readily apparent to those skilled in the art of correcting intensity inhomogeneities in the images produced by magnetic resonance imaging equipment. All such variations and modifications are intended to be encompassed by the claims set forth hereinafter.

We claim:

1. A method for correcting for intensity inhomogeneities in a radiofrequency gain field of magnetic resonance imaging equipment for imaging human tissue having intensity inhomogeneities in its radiofrequency sensitivity, comprising the steps of modeling image intensities that are due to components of said human tissue;

modeling image inhomogeneities that are not due to said human tissue;

combining said models into a nonlinear estimator of intensity inhomogeneities;

constructing an iterative algorithm for obtaining estimates from said nonlinear estimator that alternates between the following steps:

(a) estimating the probabilities of various components of said human tissue throughout an image based on the results of step (b) for each iteration except the first;

(b) estimating said intensity inhomogeneities by predicting intensities based on the results of step (a) for each iteration except the first and comparing these estimates to intensities that were observed, and filtering intensity differences;

acquiring intensity data by exciting nuclear magnetic resonance in said human tissue with a magnetic field induced by a transmitting coil of said magnetic resonance imaging equipment and then detecting currents induced in a receiving coil of said magnetic resonance imaging equipment, wherein said acquired intensity data has been disturbed by said gain field inhomogeneities;

obtaining estimates of said intensity inhomogeneities from said nonlinear estimator using said acquired intensity data in conjunction with said iterative algorithm; and displaying an image of said human tissue which has been corrected to compensate for said estimated intensity inhomogeneities.

2. The method as defined in claim 1, wherein said iterative algorithm is derived in accordance with the Expectation-Maximization algorithm with respect to said modeling.

3. The method as defined in claim 2, further comprising the step of automatically segmenting magnetic resonance images produced by said equipment.

4. The method as defined in claim 3, wherein the intensity inhomogeneities and probabilities are estimated by iteratively and alternately evaluating the following expressions:

$$W_{ij} \leftarrow \frac{[p(\Gamma_i)G_{\psi_{\Gamma_i}}(Y_i - \mu(\Gamma_i) - \beta_i)]_{\Gamma_i = tissue\text{-}class\text{-}j}}{\Sigma_{\Gamma_i} p(\Gamma_i)G_{\psi_{\Gamma_i}}(Y_i - \mu(\Gamma_i) - \beta_i)}$$

and $$\beta \leftarrow H\bar{R}$$

where H is a linear operator.

5. The method as defined in claim 4, wherein G is a non-Gaussian probability density.

6. The method as defined in claim 4, wherein G is a Parzen Window probability density.

7. The method as defined in claim 4, wherein:

$$H \equiv [+e, ovs \, \psi^{-1+ee} + \psi_\beta^{-1}]^{-1}.$$

8. The method as defined in claim 3, wherein said step of modeling the image inhomogeneities comprises the step of applying a logarithmic transformation to the radiofrequency intensity data, thereby modeling a gain field as an additive bias field.

9. An imaging system having inhomogeneities in a gain field, and having central processing means for computing corrections of said inhomogeneities, and means for acquiring intensity data that has been disturbed by gain field inhomogeneities, the improvement wherein said central processing means comprise:

a nonlinear estimator of intensity inhomogeneities; and means for obtaining estimates of said intensity inhomogeneities from said nonlinear estimator using said acquired intensity data in conjunction with an iterative algorithm which alternately performs the following estimates:

(a) an estimate of the probabilities of various components of an object throughout an image based on the results of step (b) for each iteration except the first; and (b) an estimate of said intensity inhomogeneities obtained by predicting intensities based on the results of step (a) for each iteration except the first and comparing these estimates to intensities that were observed, and filtering intensity differences.

10. The system as defined in claim 9, wherein said acquiring means comprise magnetic resonance imaging equipment for imaging human tissue having intensity inhomogeneities in its radiofrequency sensitivity and said gain field is a radiofrequency gain field.

11. The system as defined in claim 10, further comprising means for automatic segmentation of magnetic resonance images produced by said equipment.

12. The system as defined in claim 11, wherein the intensity inhomogeneities and probabilities are estimated by iteratively and alternatingly evaluating the following expressions:

$$W_{ij} \leftarrow \frac{[p(\Gamma_i)G_{\psi_{\Gamma_i}}(Y_i - \mu(\Gamma_i) - \beta_i)]_{\Gamma_j=tissue\text{-}class\text{-}j}}{\Sigma_{\Gamma_i} p(\Gamma_i)G_{\psi_{\Gamma_i}}(Y_i - \mu(\Gamma_i) - \beta_i)}$$

and $$\hat{\beta} \leftarrow H\bar{R}$$

wherein H is a linear operator.

13. The system as defined in claim 12, wherein G is a non-Gaussian probability density.

14. The system as defined in claim 12, wherein G is a Parzen Window probability density.

15. The system as defined in claim 12, wherein:

$$H \equiv [+e, ovs \, \psi^{-1+ee} + \psi_\beta^{-1}]^{-1}.$$

16. The system as defined in claim 10, wherein said iterative algorithm is derived in accordance with the Expectation-Maximization algorithm.

17. The system as defined in claim 10, wherein said central processing means further comprise means for applying a logarithmic transformation to radiofrequency gain data, thereby modeling said gain field as an additive bias field.

* * * * *